United States Patent [19]

Akino

[11] Patent Number: 4,793,792
[45] Date of Patent: Dec. 27, 1988

[54] REPRODUCTION MOLD FOR FORMING SUBSTRATE FOR RECORDING MEDIUM WITH INFORMATION SIGNAL RECORDED THEREON

[75] Inventor: Shoji Akino, Yokosuka, Japan

[73] Assignee: Canon Kabushiki Kaisha, Tokyo, Japan

[21] Appl. No.: 932,519

[22] Filed: Nov. 20, 1986

[30] Foreign Application Priority Data

Nov. 25, 1985 [JP]  Japan .................. 60-262568

[51] Int. Cl.⁴ ............................................. B29C 59/00
[52] U.S. Cl. ..................................... 425/385; 101/458; 204/192.16; 204/192.31; 425/403; 425/810
[58] Field of Search ................ 249/135; 425/810, 385, 425/403; 148/900, 4, 33, 133, 11.5 N, DIG. 83; 101/458; 204/192.31, 192.16

[56] References Cited

U.S. PATENT DOCUMENTS

| 3,649,806 | 3/1972 | Konig | 219/121 LJ |
| 3,962,495 | 6/1976 | Feldstein | 425/810 |
| 4,114,018 | 9/1978 | Von Allmen | 219/121 LJ |
| 4,188,240 | 2/1980 | Yoshio | 264/107 |
| 4,352,698 | 10/1982 | Hartley et al. | 148/900 |
| 4,435,343 | 3/1984 | Ando et al. | 264/107 |
| 4,522,659 | 6/1985 | Prusak | 148/11.5 N |
| 4,629,631 | 12/1986 | Dearnaley | 204/192.31 |
| 4,638,335 | 1/1987 | Smith et al. | 346/76 L |
| 4,680,458 | 7/1987 | Drexler | 346/76 L |

*Primary Examiner*—Willard E. Hoag
*Attorney, Agent, or Firm*—Fitzpatrick, Cella, Harper & Scinto

[57] ABSTRACT

In a precision reproducing mold for forming a substrate of a recording medium on which information signals are recored, ions are implanted into a surface bearing precise pattern, of the reproducing mold. A process for producing such mold comprises a step of implanting ions into a surface, bearing precise patterns, of the metal which is electrolytically deposited onto an original plate and then separated therefrom.

1 Claim, 1 Drawing Sheet

REPRODUCTION MOLD FOR FORMING SUBSTRATE FOR RECORDING MEDIUM WITH INFORMATION SIGNAL RECORDED THEREON

BACKGROUND OF THE INVENTION

1. Field of the Invention

The present invention relates to a precision reproducing mold, called stamper, for forming a substrate for an information recording medium on which various information signals are recorded, in particular a precision reproducing mold for a substrate for an audio disk on which audio signals are spirally recorded or an optical disk in which information recording density is several hundred times higher than that of the audio disk. Particularly, the invention relates such mold effectively usable for forming a substrate of an optical disk.

2. Related Background Art

A precision reproducing mold for forming a substrate of an audio disk or an information recording disk is produced in the following manner. At first the surface of an ordinal disk bearing recorded information thereon is rendered electroconductive by a chemical silver deposition, an electroless plating or a vacuum evaporation, and a metal, such as nickel, is deposited to a predetermined thickness by electroplating. Then the plated metal is separated from the original disk to obtain a first reproduction mold, generally called master. The master is then immersed in a solution for example of potassium bichromate to form an easily separable layer on the master, and a metal is again electroplated thereon to a thickness comparable to that of the master. The plated metal is then separated from the master to obtain a second reproduction mold, generally called mother. Subsequently an electroplated metal plate is prepared in a procedure same as that employed in preparing the mother from the master, thus obtaining a precision reproducing mold which is generally called stamper.

Said stamper is fixed in a press mold or an injection mold, and a molding composition, composed for example of polyvinyl chloride, acrylic resin or polycarbonate is poured or injected into said mold to form a substrate for an audio disk or an optical disk.

However, said molding composition may contain fine metal powder, carbon powder or dust which may generate defects on the stamper and eventually on the molded substrate, thus leading to the formation of noises or erroneous signals in the reproduction of the recorded signals. Similar defects may result from dust in the air.

In order to avoid such drawback, the U.S. Pat. No. 4,262,875 discloses a method of applying, as shown in FIG. 1, a chromium plating 11 on the surface of a stamper 12, thus protecting said surface and prolonging the service life thereof, but such method leads to another drawback of a change in the pattern of the precisely formed mold as shown in FIG. 1, due to the specific characteristic of electroplating that the metal is deposited more in the protruding portions than in the concave portions.

Recently, in order to prevent such drawback, there is proposed to form, as shown in FIG. 2, a protective layer on the stamper 22 for improving the service life by ion plating (Japanese Patent Publication No. 46298/1980, Japanese Patent Laid-open No. 89316/1983) or by, vacuum evaporation (Japanese Patent Laid-open No. 20486/1984). but such methods still are associated with the deformation of the precise patterns of the reproducing mold, thus leading to noise and erroneous signals though such deformation is apparently less than in the aforementioned case of protection with chromium plating, since these methods require a coating of several hundreds to several thousands Angstroms of a foreign substance on the surface of the stamper.

SUMMARY OF THE INVENTION

In consideration of the foregoing, the object of the present invention is to provide a precision reproducing mold which is not associated with the drawbacks of the prior technology, has an excellent service life and has no defects in the surface patterns.

The above-mentioned object can be achieved, according to the present invention, by implanting ions to the pattern bearing surface of the precision reproducing mold.

DETAILED DESCRIPTION OF THE PREFERRED EMBODIMENT

Now the present invention will be clarified in greater detail by embodiments thereof shown in the attached drawings.

Figure 1:
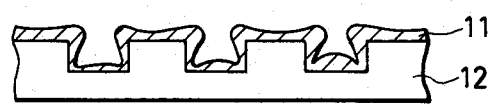
FIGS. 1 and 2 are schematic cross-sectional views of examples of conventional reproducing molds.
Figure 2:
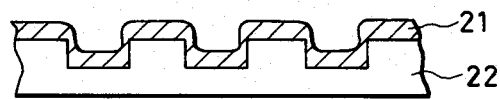
Figure 3:
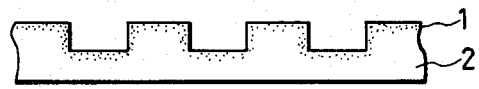
FIG. 3 is a schematic cross-sectional view of an embodiment of the precision reproducing mold of the present invention.

FIG. 3 is a schematic cross-sectional view showing an embodiment of the precision reproducing mold of the present invention. Said precision reproducing mold 2, hereinafter called "stamper", has precise patterns formed as surface projections and recesses, and ions 1 are implanted into said surface. The stamper 2 is conveniently composed, principally, of Ni or a mixture of Ni and Co. Also the ion 1 is preferably at least one selected from a group consisting of $P^+$, $B^+$, $C^+$, $N^+$ and $O^+$ or a combination of such ion or ions with $Ti^+$.

The stamper of the present invention has a high surface hardness and has a splendid durability. As an example, a stamper principally composed of Ni has a Vickers surface hardness (Hv) of at least ca. 600, or ca. 1,100 at maximum, and such hardness is usually 2 to 3 times, or 4 to 5 times at maximum, higher than that of the stamper without ion implantation. Hardness is lower than the Vickers surface hardness of ca. 2,000 obtainable with an ion plated layer of TiN or TiC, but is sufficiently high for preventing the aforementioned drawbacks.

The increase in hardness by such ion implantation is due to a partial modification of the surface area into an alloy or a ceramic material.

In such ion implantation, the ions enter the interior of the stamper 2 as shown in FIG. 3 and do not deform the surface patterns of the stamper, and such advantage cannot be expected in the protection with the ion plating.

Figure 4A:
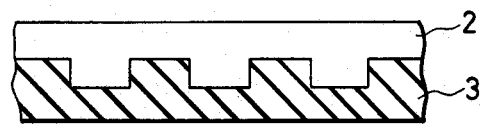
FIGS. 4A to 4C are schematic cross-sectional views showing the steps of preparation of the reproduction mold of the present invention.
Figure 4B:
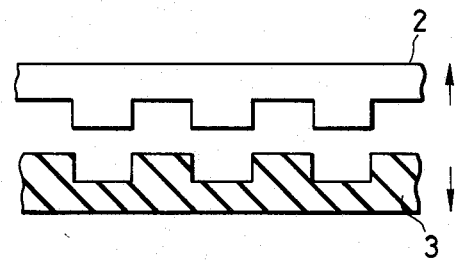
Figure 4C:
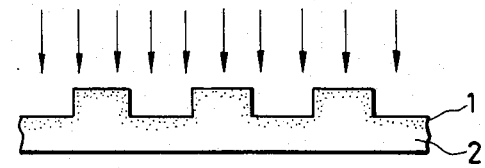

Now reference is made to FIGS. 4A to 4C for explaining the steps of preparing such stamper.

As first, as shown in FIG. 4A, the surface of an original plate 3 bearing precise surface patterns of informations signals or the like is rendered electroconductive by forming a conductive layer for example with a chemical silver deposition or an electroless plating, and a metal such as nickel is electrolytically deposited thereon to a predetermined thickness to obtain a stamper 2. The original plate 3 is for example formed by coating photoresist on a glass substrate, exposing said photoresist to a laser beam modulated according to information signals, and developing said photoresist. The stamper is preferably composed of nickel, in consideration of ease of control of the plating bath.

Then the stamper 2 is separated from the original plate as shown in FIG. 4B, and the stamper of the present invention is completed by injecting the aforementioned cations 1 into the surface of said stamper 2, by means of an ion implanting equipment employed for impurity doping into the semiconductor. Such ion implanting equipment functions by:

(1) ionizing a compound, capable of generating an ion to be implanted, by an ion generating energy;
(2) selecting an ion to be implanted by a mass spectrometer;
(3) accelerating said ion with an electrostatic field; and
(4) implanting said ion only to a target.

Preferred examples of the compound capable of generating such ion for implantation are $PH_3$, $N_2$, $CO_2$, $GB_3$, $O_2$ and $TiCl_4$.

A particularly high hardness can be obtained by selecting the following three conditions of ion implantation:

(1) implantation energy per ion, obtained by acceleration of the ion generated from the compound;
(2) implantation temperature, represented by the temperature of a stamper holder in the ion implanting equipment; and
(3) quantity of implantation, represented by the number of implanted ions (calculated by dividing the total current in the stamper at the implantation with a unit current at the implantation of an ion):

in the ranges of an implantation energy of 30 to 100 keV, an amount of implantation of $5 \times 10^{16}$ to $5 \times 10^{17}$ ions/cm$^2$ and an implantation temperature of 25° to 100° C. A most effective result can be obtained with an implantation energy of 30 to 100 keV, an amount of implantation of $1 \times 10^7$ ions/cm$^2$ and an implantation temperature of ca. 400° C., or an implantation at a low temperature followed by a thermal treatment for 1 to 2 hours at ca. 400° C. in an oven.

In the following there are shown examples indicating the relationship between the ion implantation conditions and the stamper hardness after ion implantation, wherein the stamper was principally composed of nickel of a thickness of 0.3 mm, and had a Vickers hardness Hv of ca. 200 to 250 before implantation.

(1) $p^{30}$ implantation:
 Implantation energy: 71 keV
 Amount of implantation: $5 \times 10^{17}$ ions/cm$^2$
 Implant. Temp. (° c) 25–100; 200; 400 Hv 600; 700; 1100

A very high hardness of Hv 1100 is obtained at a temperature of 400° C. presumably because the crystallization of $Ni_3P$ proceeds around said temperature.

Also an ion implantation at 25° C. followed by annealing for 1-2 hours at 400° C. provided a hardness of Hv 1000.

(2) $B^+$ implantation:
 Implantation energy: 70 keV
 Amount of implantation: $5 \times 10^{17}$ ions/cm$^2$
 Implantation temperature: 25°–100° C.
 The hardness was almost constant at about Hv 800.

(3$N^+$, $O^+$ or $C^+$ implantation:
 Implantation energy: 40 keV
 Amount of implantation: $5 \times 10^{17}$ ions/cm$^2$
 Implantation temperature: 100° C.
 The hardness was improved by 30–60% from the value before the ion implantation.

(4) $N^+$, $O^+$ or $C^+$ implantation combined with $Ti^+$:
 Implantation energy: $N^+$, $O^+$ or $C^+$ 30 keV, Ti 100 keV
 Amount of implantation: $N^+$, $O^+$ or $C^+$: 17 ions/cm$^2$; $Ti^{30}$: $1 \times 10^{17}$ ions/cm$^2$
 Implantation temperature: ca. 100° C.
 The hardness was 2 to 4 times of the value before the ion implantation.

A stamper composed of Ni-Co showed better results than in a stamper of Ni, presumably because the implanted ions react with Ni and Co to stimulate crystallization.

The ion implantation of the present invention if applied after the stamper is subjected to ion plating, further improves the surface hardness and also improve the corrosion resistance which is a drawback associated with the ion plating. Furthermore, if the ion implantation onto the ion plated layer is conducted with such a condition the ions can reach the stamper itself, poor adhesion between the stamper and the ion plated layer, which is a drawback associated with the ion plating, can be significantly improved.

The present invention is not limited to the foregoing embodiment but can be applied in various manners. For example, through the stamper is directly prepared from the original plate, it is also possible, as explained in the conventional technology, to prepare a master and a mother from the original plate and to prepare the stamper from said mother. The present invention includes all such modifications within the scope and spirit of the appended claim.

What I claim is:

1. A precision recording mold having a surface bearing precise patterns for forming a substrate of a recording medium capable of recording information signals; said mold being principally composed of a material selected from the group consisting of nickel or a mixture of nickel and cobalt, wherein said surface having implanted therein titanium ions and ions selected from the group consisting of phosphorus ions, boron ions, carbon ions, nitrogen ions, oxygen ions and mixtures thereof.

* * * * *